United States Patent [19]

Beiswenger et al.

[11] Patent Number: 4,958,911
[45] Date of Patent: Sep. 25, 1990

[54] LIQUID CRYSTAL DISPLAY MODULE HAVING HOUSING OF C-SHAPED CROSS SECTION

[75] Inventors: John L. Beiswenger, Salem, Wis.; Darrell N. Chelcun, Buffalo Grove, Ill.

[73] Assignee: Jonand, Inc., Chicago, Ill.

[21] Appl. No.: 259,802

[22] Filed: Oct. 19, 1988

[51] Int. Cl.$^5$ .......................... G02F 1/13; H03K 5/02
[52] U.S. Cl. ............................... 350/331 R; 350/337; 350/345; 174/52.1
[58] Field of Search ..................... 350/345, 339 F, 337, 350/338, 352, 332, 334, 333; 362/84, 29, 221, 225; 217/10, 11; 340/718, 765; 174/52.1, 52.4

[56] References Cited

U.S. PATENT DOCUMENTS

| | | | |
|---|---|---|---|
| 4,025,162 | 5/1977 | Yagi | 350/332 X |
| 4,247,928 | 1/1981 | Dorfman | 350/345 |
| 4,386,826 | 6/1983 | Stolov | 350/345 |
| 4,474,432 | 10/1984 | Takamatsu et al. | 350/336 |
| 4,506,956 | 3/1985 | Dir | 350/339 F |
| 4,566,758 | 1/1986 | Bos | 350/347 E |
| 4,582,396 | 4/1986 | Bos et al. | 350/347 E |
| 4,610,507 | 9/1986 | Kamamori et al. | 350/339 F X |
| 4,611,889 | 9/1986 | Buzak | 350/345 |
| 4,626,074 | 12/1986 | Crossland et al. | 350/345 |
| 4,635,051 | 1/1987 | Bos | 350/337 |
| 4,649,381 | 3/1087 | Masuda et al. | 350/345 X |
| 4,652,087 | 3/1987 | Bos et al. | 350/347 E |
| 4,670,744 | 6/1987 | Buzak | 350/334 |
| 4,690,510 | 9/1987 | Takamatsu et al. | 350/334 |
| 4,727,285 | 2/1988 | Taniguchi | 350/330 |
| 4,755,035 | 7/1988 | Kopish et al. | 350/345 |
| 4,772,100 | 9/1988 | Suenaga | 350/333 |
| 4,796,977 | 1/1989 | Drake | 350/334 |
| 4,836,651 | 6/1989 | Anderson | 350/336 |
| 4,862,153 | 8/1989 | Nakatani et al. | 350/334 |

OTHER PUBLICATIONS

T. J. Scheffer, "New multicolor liquid crystal displays that use a twisted nematic electrooptical cell", J. Appl. Phys., vol. 4, No. 11, Nov. 1973, pp. 4799–4803.
Shanks, "Electro-optical Colour Effects by Twisted Nematic Liquid Crystal", Electronics Letters, Apr. 4, 1974, vol. 10, No. 7, pp. 90–91.
Gerald M. Murch–Human Factors Research, Tektronix, Inc. "The Effective Use of Color and Display Technology" 9/84 8–pages.
Mike Vance–LCS SPU, Tektronix, Inc. "A Field-Sequential Color Graphics System Using the Liquid Crystal Shutter" 9/84 12–pages.

Primary Examiner—Stanley D. Miller
Assistant Examiner—Tai V. Duong
Attorney, Agent, or Firm—Garrettson Ellis

[57] ABSTRACT

A liquid crystal display module defines a housing of essentially C-shaped cross-section for improved economy and for connection, protection, and support of the liquid crystal display and backlighting elements. Additionally, the drivers for the LCD may be so located by this invention, as to make room for a more intense light source to illuminate the LCD display. Also, the LCD module may exhibit a software variable color display through the use of one or more white or different color light sources and color polarizers. The invention also includes an improvement to the conventional means of applying printed circuitry to the unique housing.

34 Claims, 4 Drawing Sheets

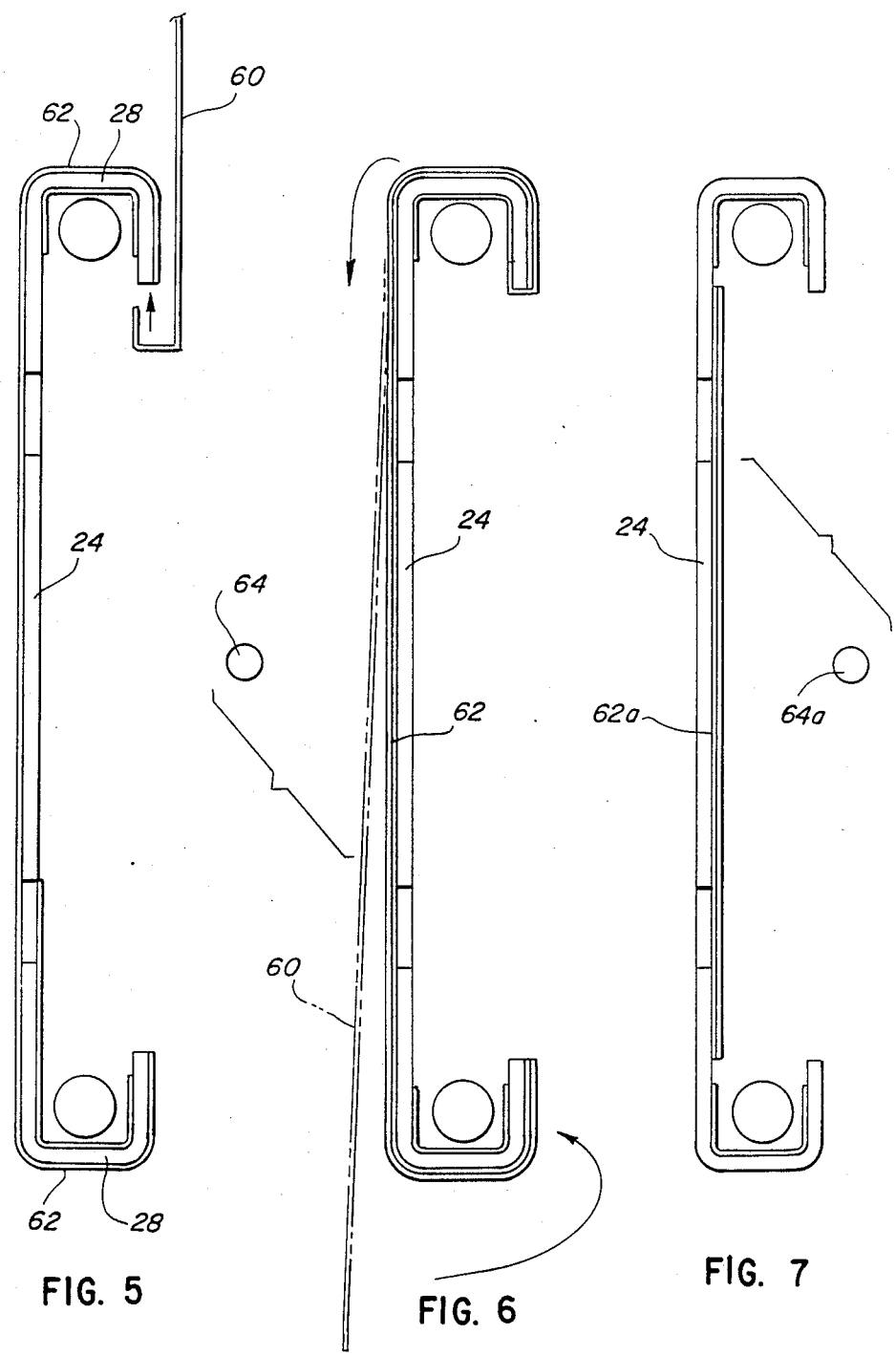

LIQUID CRYSTAL DISPLAY MODULE HAVING HOUSING OF C-SHAPED CROSS SECTION

TECHNICAL FIELD

Liquid Crystal Displays, known as LCDs, are commonly used in electronic devices such as calculators, watches, alarm clocks, timers, mobile phones, depth finders, and lap-top computers in which the driving circuitry for the LCD is an integral part of the product's other electronic circuit assemblies. However, there are many more applications for LCDs in which full integration of the driving circuitry is not practical, desirable, or even possible. In these applications an electronic assembly, which typically integrates the LCD and driving circuitry, is used. This assembly is commonly called an LCD module. The term "driving circuitry": is used in the broad sense to include all circuit components and, typically, printed circuit wiring required to receive instructions from other controls, circuits or devices and to display in turn the appropriate information on the LCD.

LCDs by their nature do not include a source of light with which to view the information displayed, and so most LCDs used in LCD modules presently available incorporate a means of reflecting light that enters the front of the LCD off of the rear surface of the LCD so that opaque LCD segments or pixels can be displayed in silhouette against the reflector's usually silver background. Since a reflector serves as an illuminated background only when ambient light is sufficient, many LCD modules incorporate a means of backlighting the LCD. Sometimes, both a backlighting means and a reflector are used in combination. In this case the reflector is constructed to pass some percentage of light so that the backlighting can be seen through the reflector when the ambient light level is sufficiently low. This type of reflector is commonly called a transflector. Typically the backlighting of LCDs in most LCD modules is provided by electroluminescent panels, with the light passing through a transflector.

Current disadvantages of the typical LCD modules on the market include the fact that the typical electroluminescent panel used does not provide enough light for easy reading of the LCD in all circumstances. However, current commercial construction techniques of LCD modules have rendered it impractical to replace electroluminescent panels with another light source such as a fluorescent bulb. Specifically, it has been typically necessary to place the "drivers" (used in the narrow sense to mean driving components that are in direct contact with the LCD terminals) of the liquid crystal display in very close proximity to the LCD terminals because: (1) due to the design of most drivers it is preferable to have a short electrical path between driver terminals and LCD terminals, to minimize the capacitance and inductance of the load for each driver, and (2) because the drivers typically connect to the liquid crystal display terminals through a conductive elastomeric connector typically made of silicone compounds or the like. Accordingly, the circuit link through such conductive material has desirably been made as short as possible since the electrical resistance of such material is substantially higher than conductors of solid metals.

This results in the preferred placement of drivers on the side of the printed circuit board facing the LCD, so that the conductive path between the drivers and LCD can be made as short as possible. In addition, the elastomeric connector joining the LCD contacts with the printed circuit, and therefore the driver circuitry, is preferably as short as possible to keep the impedance low. These two factors result in very little available space between the printed circuit board and the LCD, so that only electroluminescent backlighting panels can be used as a practical matter.

In accordance with this invention, an improved, easily manufacturable design of an LCD module is provided in which the drivers of the LCD circuitry can be removed out of close proximity with the liquid crystal display without having excessive resistance in the conductive connections therebetween. Because of this, and also because of the improved configuration of the printed circuit component for the LCD module, it becomes possible to replace the electroluminescent light source with more intense sources of light such as fluorescent bulbs or the like incorporated into the LCD module. Thus, the LCD may be brightly lit in the manner of a TV screen rather than dim, as has been previously customary in LCD modules. Also by this invention a multiple color LCD display may be provided.

DESCRIPTION OF THE INVENTION

In this invention, a liquid crystal display module is provided which comprises a liquid crystal display (LCD) mounted in a housing, preferably of essentially C-shaped cross-section, the liquid crystal display being attached to opposed ends of the C-shaped cross-section of the housing, the point of attachment being preferably at opposed edges of the liquid crystal display. Electronic control means are positioned on the housing, particularly for driving the liquid crystal display as is generally conventional. Also, conductor means are provided, carried by the housing, providing electronic communication between the electronic control means positioned on the housing and the liquid crystal display.

Preferably, at least some of the electronic control means described above is carried on the side of the housing which is opposed to the liquid crystal display. In this circumstance, it is preferred for at least part of the conductor means to extend about a curved surface portion of the housing defined by the C-shaped cross-section. It is to be understood that the term "curved surface" may include a C-shaped cross-section which is rather square in shape, the corners of the bends of such cross-section being radiused and typically not absolute square corners. The conductor means are preferably conductive printed circuit lines (traces) adhering to the housing, particularly in the area where the conductor means extend around the curved ends of the C-shaped cross-section of the housing.

This facilitates the opportunity of the housing to carry, within the C-shaped cross-section, light producing means comprising at least one light bulb, and preferably a pair of fluorescent bulbs, to provide back illumination of the liquid crystal display. Thus the display seen by the viewer can be greatly brightened with respect to present-day, conventional LCDs.

The C-shaped housing may be made of plastic extruded in the C-shaped cross-section, for ease of manufacture and for cost saving. This housing is preferably substantially rigid, to provide protection and support to the liquid crystal display, being preferably made of a strong, rigid, high temperature plastic such as General Electric Ultem, or a polysulfone material. However, any appropriate plastic may be used. The C-shaped cross-section provides added strength to the housing, for protection of the typically glass light bulbs and liquid crystal display. The display is held in position between the arms of the C-shaped cross-section.

The conductor means carried on the housing, and the liquid crystal display may be electrically connected with an electrically conductive adhesive, which may also serve as adhesive for retaining the LCD in the housing. For example, a conductive hot melt adhesive manufactured by Elform, Inc. of Reno, Nevada may be used for this purpose, or any other desired, commercially available electrically conductive adhesive. Thus a conductive elastomeric connector may be avoided.

It is also desirable for the C-shaped housing to define a projection on an edge of the housing that extends parallel to the C-shaped cross-section (i.e. a side edge). Some of the conductor means may be carried on the projection, to define an edge connector for connection of the conductor means and electronic circuitry means to other circuitry. This projection may be formed by simply cutting away portions of the extruded, C-shaped module to leave behind the projection, having a shape as desired.

As stated above, the liquid crystal display of this invention is also capable of display in multiple colors. The means by which this is accomplished may be used in conjunction with the C-shaped cross-section housing of this invention as described above, but it also may be used in conjunction with other designs of liquid crystal displays, including liquid crystal displays which are known to the prior art, apart from modifications which might be made in accordance with this invention necessary to get the color display.

To obtain a color liquid crystal display, the LCD of this invention typically comprises conventional liquid crystal material entrapped in a substantially planar area between a pair of transparent plates, typically making use of a conventional LCD assembly. One or more light sources are positioned to one side of the plates of the LCD assembly. The light sources may be white or may provide light of a first color and a second color, for example, colors which are complimentary to each other to be capable of combining to form white light, such as red and blue-green lights.

Means are provided for polarizing the light of the first color to substantially a first angle, and for polarizing light of the second color to substantially a second angle which is substantially different from the first angle. The spaced light sources and means for polarizing the light are positioned so that the polarized light of first and second color strikes the one side of the LCD plates.

Electronic means are provided for selectively providing a plurality of regions (known as pixels in dot matrix configuration) of liquid crystal material in a typically substantially planar area. These have the capability of either rotating (twisting) or not rotating (not twisting) the light passing through the liquid crystal material. As is known, liquid crystal molecules are normally in a mode to twist the polarization of passing light, but can be realigned by electrical stimulus so that the polarization of passing light is not so twisted.

Added polarizing means is also positioned to receive light from the LCD, and to block light polarized at a given angle, such that the first color light at the first angle from a given LCD region or pixel passes through the added polarizing means only when twisted by the liquid crystal molecules that are not receiving electrical stimulus. The second color light at the second angle from the given LCD region or pixel passes through the added polarizing means only when not twisted by the liquid crystal molecules when they are under electrical stimulation.

Thus the device of this invention can permit passage, through the LCD with added color polarizing means, of one, but not both, of the first and second polarized, colored light for any given time through any given region or pixel as controlled by the electronic means.

The spaced light sources are typically each positioned to illuminate substantially all of the one side of the plates, when multiple color operation is desired across the entire area of the plates.

The light components of the first and second colors are preferably polarized perpendicular to each other so that, preferably, maximum transmission of light of one color, and essentially zero transmission of light of the other color is always taking place at each pixel, as controlled by the electronic means. The preferred twist angle provided to the light by the liquid crystal fluid (when provided) is also about 90 degrees in this case, and the polarization angle of the added polarizing means is generally parallel to the second angle.

The electronic means typically includes means for "dithering" the twisting capability of each region back and forth to permit the alternating passage therethrough of the first color and the second color at a rate of at least essentially twenty cycles (forty color changes) per second, which is approximately the slowest rate that is substantially invisible with the human eye. This can provide an apparent variation of colors perceived from the side of the plates opposed to the one side, depending on the relative amount of time that each color is allowed to pass through the region or pixel. For example, when the first color of the respective light sources is blue and the second color is red, if certain pixels of the LCD are dithered at above 20 color cycles per second in which the pixel transmits red some of the time but also transmits blue for some of the time, the eye will perceive a shade of magenta. Other colors may also be created with other variations of dithering, as well as other color light sources, color polarizers, and color filters.

Thus, by appropriate selective control of all of the pixels in the LCD, bright, colored pictures and indicia may be created in the LCD, providing many colors as may be desired. In accordance with known electronics, the pictures may move, or they may change color in accordance with the dithering rates of the particular pixels involved as controlled by the electronics, which electronics are conventionally designed with ease by any competent electronics engineer once the objects of this invention are understood.

The polarizing means used in this invention to polarize light of the first color to a first angle and to polarize light of the second color to a substantially different second angle may comprise a first polarizing filter positioned between the light sources and the plates that entrap liquid crystal material. The first filter passes light of the first color but substantially passes only light of the second color that is polarized at substantially the second angle. A second polarizing filter is positioned between the first filter and the plates. The second filter passes light of the first color but substantially passes only light of the first color that is polarized at substantially the first angle. Thus, by this, the LCD may receive 2-color light, typically across its entire area, the one color component of the light being polarized at the first angle and the other component of the colored light being polarized at the second angle which is preferably substantially perpendicular to the first angle.

Such polarizing filters are commercially available, each comprising a transparent plate with transparent, colored lines, which would correspond to the first color in the first polarizing filter and the second color in the second polarizing filter. These lines are translucent, and are so closely spaced that they absorb light of a different and particularly complimentary color, except for that portion of the complimentary light which oscillates in a direction substantially parallel to the closely spaced lines. At the same time, light of the color of the polarizing filter is transmitted through the filter in unpolarized manner. Thus, use of a pair of commercially available polarizing filters as described above can provide the desired situation where twocolor light impinges the LCD, with one color being polarized at the first angle and the other color polarized at the second angle.

The added polarizing means may be a typical, conventional, noncolored ("black") polarizer.

Thus the invention of this application can provide a multicolored LCD, while also providing a brilliant LCD image having a strong, protective, inexpensive support structure.

By this invention, a printed thin film electrical conductor may also be applied to the housing, particularly for communication between the LCD and the driver, which, as stated above, may be placed on the back of the housing rather than the front to make room for fluorescent lights or other light source within the housing.

By this invention, one may improve a conventional technique of applying thin film electrical conductors to the housing by the improved steps in the process of (1) plating the housing with typically a thickness of copper or the like including at least part of the curved surface of the housing, for example, the arms of a C-shaped housing; and (2) applying a photoresist layer to the housing over the conventional, plated metal conductive coating. (3) One then covers the photoresist layer, including the layer on the curved surface, with a flexible art, (for example a 1 to 1 photographic art) having transparent and opaque portions arranged in a predetermined pattern. (4) One irradiates the photoresist layer through the flexible art to insolubilize portions of the photoresist layer adjacent transparent portions of the art, while leaving soluble those portions of the layer which are shielded by the opaque portions. (5) One then washes away from the housing the remaining soluble portions while retaining the insoluble portions, ready for normal etching away of the thus-uncovered, plated metal coating portions.

This novel technique may then be incorporated into the other steps of a desired process for printing thin film electrical conductors on the housing in accordance with conventional techniques, and is used to provide conductive lines about the curved portion of the housing for the advantages described above, particularly with respect to the housing of C-shaped cross-section previously discussed.

DESCRIPTION OF DRAWINGS

In the drawings.

FIGS. 5–7 are end elevational views of the housing of the module of FIG. 1, with certain novel steps in the preparation of printed conductive circuitry carried on the module being shown.

DESCRIPTION OF SPECIFIC EMBODIMENTS

Figures 1, 2:
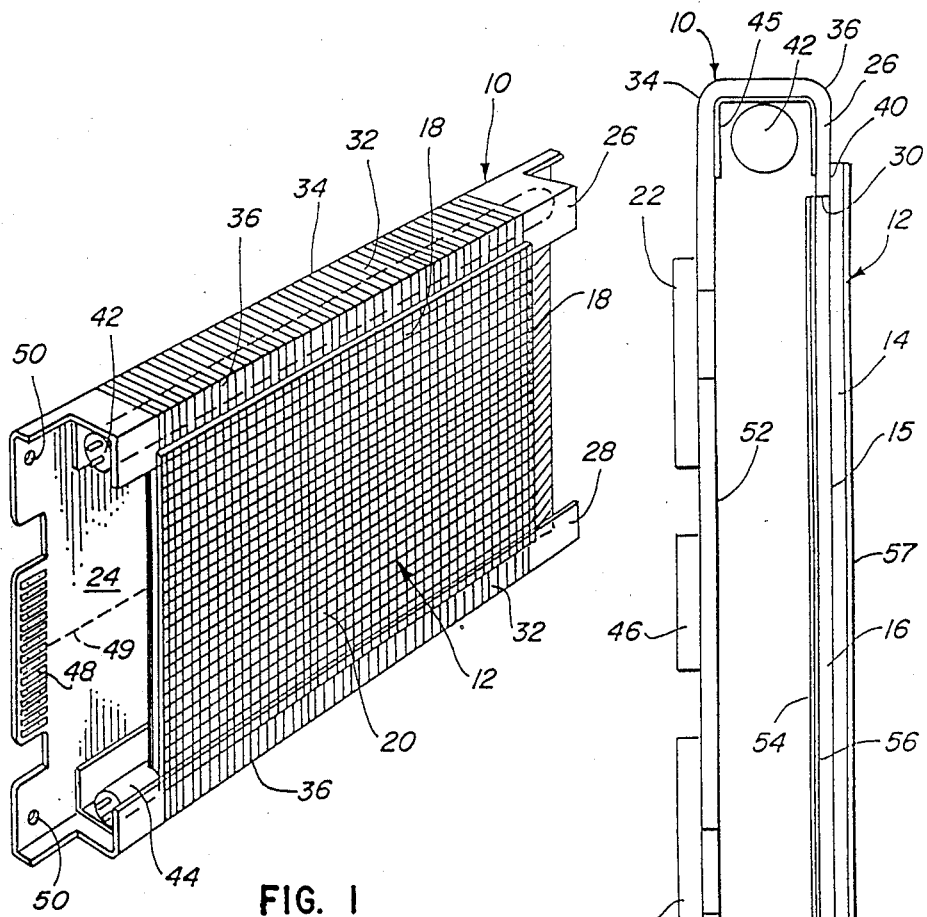
FIG. 1 is a perspective view of a liquid crystal display module in accordance with this invention.
FIG. 2 is an enlarged end elevational view of the module of FIG. 1.

Referring to FIGS. 1–4, liquid crystal display module 10 is disclosed. Module 10 comprises a conventional liquid crystal display 12, for example a commercially available LCD making use of a liquid crystal material entrapped in a substantially planar area 15 between glass panes 14, 16. Planar area 15 may be a curved plane if desired.

As is conventional, electronic circuitry 18 is provided on liquid crystal display plate 12, to create in conventional manner a two-dimensional array of generally rectangular pixels 20, which may be independently controllable by circuitry 18 in accordance with conventional LCD technology. Control of the pixels 20 through circuitry 18 is provided by driver units 22, which are positioned on the rear side of housing 24, shown particularly in FIG. 2 to be of C-shaped cross-section to provide extending arms 26, 28 which are typically connected to opposed edges 30 of inner plate 16 of liquid crystal display 12.

Figure 3:
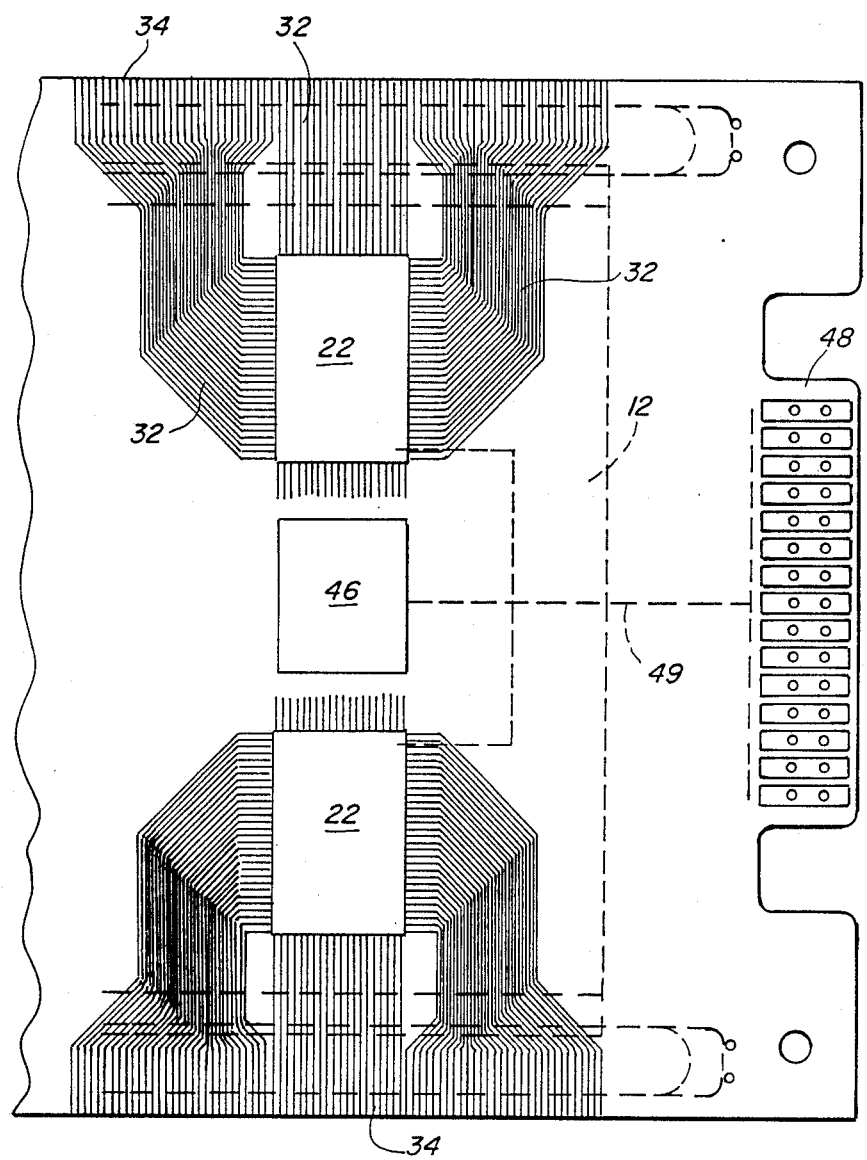
FIG. 3 is a fragmentary elevational view of the back side of the module of FIG. 1.
Figure 4:
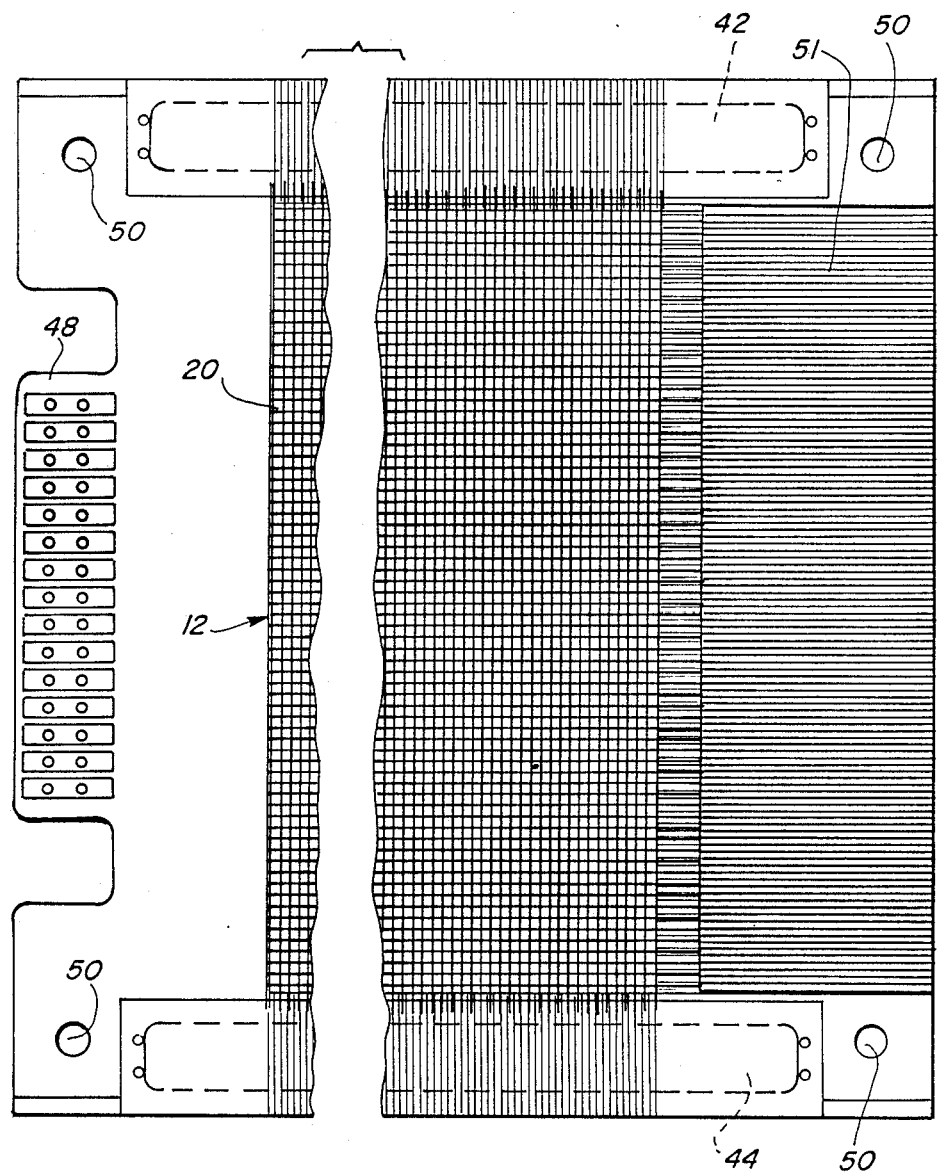
FIG. 4 is an enlarged, fragmentary elevational view of the front side of the module of FIG. 1.

As shown particularly in FIGS. 1 and 3, an array of printed circuit lines 32 extend from each driver 22 over the respective curved edges 34, 36, over the C-shaped arms 26, 28, into contact with the opposed edges of LCD 12, in the general area of reference number 30. There, the individual lines of printed circuitry are positioned in electrical contact with the individual lines of LCD circuit means 18, with the connection being typically reinforced by means of a conductive adhesive, typically at area 40, as in FIG. 2, so that individual signals from individual printed circuit lines 32 may be picked up by individual circuit lines of circuitry 18, for individual electronic control of the pixels.

Housing 24, of C-shaped cross-section, and LCD 12, define a hollow interior which may serve as a "light box". A pair of fluorescent lights 42, 44 are positioned within the housing 24, typically at the respective top and bottom thereof, with metal reflector members 45 being provided to each fluorescent light, to both reflect light and to serve as a shield against the electronic noise of lights 42, 44. Fluorescent light 42 may be blue-green in color, while light 44 may be red, so that preferably the two colors emitted by the respective fluorescent lights 42, 44 form white light in summation, although other colors of light may be used in accordance with this invention as may be desired. It is generally preferred for the lights to be complimentary to each other to together form white light. Driver 46 for fluorescent lights 42,44 may also be provided on the rear side of housing 24 as shown.

Housing 24 may be made of an extruded material in its C-shaped cross-section with the corners 34, 36 being radiused to permit easy preparation and good adhesion of conductive lines 32 extending therearound. Alternatively, housing 24 may be made by injection molding or the like, especially if the housing is to carry asymmetrical portions or the like as special components.

Portions of extruded housing 24 may be cut away in an early step of processing so as to provide projection 48. Printed circuit 49 may extend from projection 48 to LCD drivers 22, and fluorescent driver 46, so that the projection may define an edge connector for connection thereof to other circuitry and also a power source. Holes 50 are provided to permit easy attachment of liquid crystal display module 10 to a desired panel in its environment of use.

Multistrand ribbon cable 51 may be attached with thermobonded adhesive or the like to the LCD end as shown, to connect with cross rows of pixels 20 and drivers 22, for a conventional setup of the pixel system.

Housing 10 is made of a strong plastic, the C-shaped structure providing a substantially rigid form, for protection of LCD plate 12.

In use, fluorescent lamps 42, 44 are lit, providing a light box effect to the rear face of LCD plate 12. If desired, inner surface 52 of housing 24 may be a white surface to diffuse the light which is reflected at low angle from LCD 12 toward white surface 52.

The mixed red and blue-green light provided by lamps 44, 42 passes first through blue-green polarizing filter 54, which, as previously described, comprises a transparent plate with a myriad of translucent, thin blue-green lines which are preferably spaced apart from each other with clear material so as to absorb light of different and particularly complementary color, passing only blue-green light except for that portion of light which oscillates in a direction substantially parallel to the closely spaced blue-green lines. Thus, the blue-green light of lamp 42 is diffused on surface 52 and then passes through polarizing filter 54 substantially unhindered, but substantially only that red light from lamp 44 passes which is polarized in the direction of the blue lines of polarizing filter 54. The remaining components of the red light are absorbed.

Light which is passed through polarizer 54 then encounters red polarizing filter 56. This filter typically comprises a myriad of translucent red lines, parallel and spaced apart from each other by clear material so as to block light of different and particularly complementary color, passing only red light except for that portion of light which oscillates in a direction substantially parallel to the closely spaced red lines. Thus, the polarized red light that passes through filter 54 passes through polarizing filter 56 substantially unimpeded, but substantially only that component of the blue-green light which is polarized in the direction parallel to the red lines of polarizing filter 56 is passed.

The blue-green lines of polarizing filter 54 and the red lines of polarizing filter 56 are preferably essentially perpendicular to each other, and serve to define the above-described first and second polarization angles of the colored light.

Accordingly, the light of perpendicularly polarized red and blue-green components now passes through LCD plate 12. The individual pixels 20 of LCD 12 conventionally exhibit two states, a rotating state and a nonrotating state, to rotate or not rotate polarized light in a manner governed by circuitry 18 and drivers 22 in generally conventional manner, except as otherwise described herein. The pixels 20 of liquid crystal material in planar area 15 are positioned to rotate passing polarized light by typically 90 degrees when free of electronic stimulation, but to provide no polarizing rotation when electronically stimulated.

Additional, third, colorless or "black" polarizer 57 is then provided to receive light from LCD 12. Polarizer 57 is set to pass light at typically an angle which is generally the same as the polarizing angle of one of color polarizers 54 or 56, specifically polarizer 54. Thus, when a pixel 20 is not under electronic stimulation, it rotates light passing through it so that blue-green light polarized by polarizer 56 is blocked by polarizer 57, but polarized red light (with a polarization angle perpendicular to the blue-green) is rotated to an angle permitting passage through polarizer 57.

When the same pixel 20 is under electronic stimulation, passing light is not rotated. Thus the blue-green light polarized by polarizer 56 passes through polarizer 57, but the red light is blocked.

Thus, depending upon the polarizing mode imposed by drivers 22, the apparatus of this invention will either pass red or blue-green light at each pixel 20.

Drivers 22, by means of a conventional oscillator circuit, can dither the polarizing state of the pixels at a rate over 20 cycles per second, preferably of about 30–50 cycles (60–100 changes) per second, to provide an appearance of any or all pixels to the human eye of varying colors of the spectrum, depending on the percentage of time that red light is allowed to pass and the percentage of time that the blue-green light is allowed to pass.

Thus, when one views LCD plate 12 from its outwardly facing side, one can see a bright, multi-colored display of any type desired, as governed by drivers 22 and the other electronics of the system. For example, a program may be fed to drivers 22 from conventional electronics via edge connector 48, to provide a display which can operate in a manner similar to television, if desired.

One may also operate with a single color light source to provide an LCD image of varying intensities of that color and black. One may dither as before, or selectively dim the light source as desired to obtain the varying intensities, with either a single or a double color light source. Also, one may obtain a color LCD using a white light source and color polarizers 54, 56, but in that case one cannot provide black to the image, while with use of the two colored light sources that match the colors of polarizers 54, 56, one can provide black to the image by turning off one of the colored light sources.

For example, one may turn off one of lights 42, 44 to produce a display of bright color pixels on a black background or vice versa, and, by dithering, all shades of the color simultaneously. One may then turn on both light sources on for different color effects.

Referring to FIGS. 5–7, a modification of a conventional process for applying printed circuit lines to a substrate is disclosed. As shown in FIG. 5, housing 24 may have printed electronic circuitry placed on it, and particularly curved arms 28 of the C-shaped cross-section by the use of a flexible, 1 to 1 photographic art 60 which contains the desired image of the circuit lines.

As a step in an otherwise conventional process for the application of printed circuit lines to a substrate, a layer of a photoresist material 62 of any desired and conventional type may be placed on housing 24 as shown in FIG. 5, typically over a conventionally plated metal layer. Then, as shown in FIG. 6, one covers photoresist layer 62 with the flexible art 60 having the desired transparent and opaque portions. One then irradiates with an ultra-violet lamp 64 or the like through flexible art 62 to insolublize photoresist layer 62, leaving soluble those portions of layer 62 which are shielded by the opaque portions.

Following this, one may wash away from the housing the remaining soluble portions, while retaining the insoluble portions, and one may then proceed to etch in conventional manner to produce the printed conductive circuit lines 32 on housing 24 shown in FIG. 3.

One may also rotate the housing during the irradiation step as needed to properly irradiate all of the curved surfaces on the housing, when such a housing is used.

Circuit lines 32 may be covered with separate conductive adhesive lines at area 40 by a silk screening process. Then, the adhesive lines may be used to adhere LCD 12 to housing 10 with separate circuit lines being held in electronic communication with separate circuit lines 18 of the LCD.

As an alternate step, typically performed in addition and concurrent to the step of FIGS. 5 and 6, one may apply a photoresist layer 62a to the inner surface of housing 24, and apply a photographic art 60a over layer 62a as shown. Then, irradiation with an ultraviolet light source 64a or the like, can cause the same effect on photoresist layer 62a, followed by similar steps to those described above in a conventional process for providing circuit lines on the inner surface of housing 24.

The above has been offered for illustrative purposes only, and is not intended to limit the scope of the invention of this application, which is as defined in the claims below.

That which is claimed is:

1. A liquid crystal display module which comprises:
   a liquid crystal display;
   a housing of essentially C-shaped cross-section, said liquid crystal display being attached to opposed ends of the C-shaped cross section of the housing;
   electronic control means positioned on said housing; conductor means carried by said housing and providing electronic communication between said electronic control means and said liquid crystal display;
   at least a pair of spaced light sources positioned within said housing to back-illuminate the liquid crystal display, said light sources each respectively emitting light of a first color and a second color;
   means for polarizing said light of said first color to substantially a first angle, and for polarizing light of said second color to a second angle which is substantially different from the first angle, said polarizing means being positioned in registry with said liquid crystal display for light transmission therethrough;
   said electronic control means selectively providing a plurality of regions of liquid crystal material in said liquid crystal display with independently controllable rotating and non-rotating capability of the polarization of light passing therethrough; and
   added polarizing means, positioned in registry with the liquid crystal display for transmission of light therethrough, whereby passage of one, but not both, of said first and second polarized, colored light at any given time takes place through each region as controlled by said electronic control means.

2. The display module of claim 1 in which at least some of said electronic control means is carried on the side of said housing which is opposed to said liquid crystal display, at least part of said conductor means extending about an outer curved surface portion of said housing defined by said C-shaped cross-section.

3. The display module of claim 2 in which said conductor means comprises at least in part conductive, printed circuit lines adhering to said housing.

4. The display module of claim 1 in which said liquid crystal display is attached at opposed edges thereof to said housing.

5. The display module of claim 1 in which said housing carries, within said C-shaped cross section, a light source comprising at least one light bulb to provide back illumination of said liquid crystal display.

6. The liquid crystal display module of claim 1 in which the first and second colors are complementary to each other, to be capable of combining to form white light.

7. The liquid crystal display module of claim 6 in which the first and second angles are substantially perpendicular to each other.

8. The liquid crystal display module of claim 1 in which said light source comprises a pair of fluorescent lamps.

9. The liquid crystal display module of claim 1 in which said C-shaped housing is made of plastic extruded in said C-shaped cross-section.

10. The liquid crystal display module of claim 1 in which said housing is substantially rigid, to provide protection and support to said liquid crystal display.

11. The liquid crystal display module of claim 1 in which said conductor means and liquid crystal display are electrically connected with an electrically conductive adhesive.

12. The liquid crystal display module of claim 1 in which said C-shaped housing defines a projection on an edge of said housing that extends parallel to said C-shaped cross-section, some of said conductor means being carried on said projection, to define an edge connector for connection of said conductor means and liquid crystal display to other circuitry.

13. A liquid crystal display module which comprises:
   a liquid crystal display comprising liquid crystal material entrapped in a substantially planar area;
   a housing of essentially C-shaped cross-section, said liquid crystal display being attached to opposed ends of the C-shaped cross-section of said housing;
   electronic control means positioned on said housing, said electronic control means being carried on the side of said housing which is opposed to said liquid crystal display; conductor means carried by said housing and providing electronic communication between said electronic control means and said liquid crystal display; at least part of said conductor means extending about an exterior curved surface portion of said housing defined by said C-shaped cross-section; and
   said housing carrying, within said C-shaped cross-section, light producing means comprising at least one light source to provide back illumination of said liquid crystal display.

14. The display module of claim 13 in which said conductor means comprises, at least in part, conductive, printed circuit lines adhering to said housing.

15. The display module of claim 13 in which said liquid crystal display is attached at opposed edges thereof to said housing.

16. The display module of claim 15 in which said housing is substantially rigid, to provide protection and support to said liquid crystal display.

17. The display module of claim 15 in which said C-shaped housing is made of plastic extruded in said C-shaped cross-section.

18. The display module of claim 15 in which said conductor means and liquid crystal display are electrically connected with an electrically conductive adhesive.

19. The display module of claim 15 in which said C-shaped housing defines a projection on an edge of said housing that extends parallel to said C-shaped cross-section, some of said conductor means being carried on said projection, to define an edge connector for connection of said conductor means and electronic circuitry means to other circuitry.

20. A liquid crystal display module which is capable of display in multiple colors, which module comprises:
liquid crystal material entrapped between a pair of transparent plates forming a liquid crystal display;
a pair of light sources of first and second colors, each of said light sources being positioned to illuminate substantially all of one side of said plates; means, in registry with said liquid crystal display, for polarizing said light of said first color to substantially a first angle and for polarizing light of said second color to substantially a second angle which is substantially different from said first angle; electronic control means for selectively and independently providing a plurality of regions of liquid crystal material in said liquid crystal material in said liquid crystal display with rotating and non-rotating capability of the polarization of light passing therethrough; added polarizing means, in registry with the liquid crystal display; and metal reflector means provided to said light sources to direct light to said plates and to serve as electronic noise shield means.

21. The liquid crystal display module of claim 20 in which the first and second colors are complementary to each other, to be capable of combining to form white light.

22. The liquid crystal dispaly module of claim 20 in which the first and second angles are substantially perpendicular to each other.

23. The liquid crystal display module of claim 20 in which at least a pair of spaced light sources are positioned to one side of said plates, said light sources each respectively emitting light of said first color and second color.

24. The liquid crystal display module of claim 20 in which said electronic control means includes means for dithering the rotating and nonrotating capability of each liquid crystal region back and forth to permit the alternating passage therethrough of said first color and said second color at a rate of at least essentially 20 cycles per second, to provide an apparent variation of colors perceived from the side of said plates opposed to the one side, depending on the relative amount of time that each color is allowed to pass through a region.

25. The liquid crystal display module of claim 20 in which said polarizing means comprises:
a first polarizing filter positioned between said light source and said plates, said first filter passing light of said first color but substantially passing only light of said second color that is polarized at substantially said second angle;
a second polarizing filter positioned between said first filter and said plates, said second filter passing light of said second color but substantially passing only light of said first color that is polarized at substantially said first angle.

26. The liquid crystal display module of claim 20 in which said added polarizing means is a colorless polarizer.

27. The liquid crystal display module of claim 20 in which said light source and polarizing means comprises a source of white light which passes through a first polarizing filter positioned between said light source and said plates, said first filter passing light of said first color but substantially passing only light of said second color that is polarized at substantially a second angle;
a second polarizing filter positioned between said first filter and said plates, said second filter passing light of said second color but substantially passing only light of said first color that is polarized at substantially a first angle.

28. The liquid crystal display module of claim 27 in which said electronic control means includes means for dithering the rotating and non-rotating capability of each liquid crystal region back and forth to permit the alternating passage therethrough of said first color and said second color at a rate of at least essentially 20 cycles per second, to provide an apparent variation of colors of light passing through a given region of said liquid crystal display depending on the relative amount of time that each color is allowed to pass through said region.

29. The liquid crystal display module of claim 28 in which said first and second angles are substantially perpendicular to each other, and in which said added polarizing means is a colorless polarizer.

30. A liquid crystal display module which comprises:
a liquid crystal display comprising liquid crystal material entrapped in a substantially planar area;
a housing of essentially C-shaped cross section, said liquid crystal display being attached to opposed ends of the C-shaped cross section of said housing;
electronic control means positioned on said housing, said electronic control means being carried on the side of said housing which is opposed to said liquid crystal display;
conductor means carried by said housing and providing electronic communication between said electronic control means and said liquid crystal display, at least part of said conductor means extending about an outer curved surface portion of said housing defined by said C-shaped cross section;
said housing carrying, within said C-shaped cross section, light producing means comprising at least one light source to provide back illumination of said liquid crystal display;
means in registry with said liquid crystal display for polarizing light of a first color from said light source to substantially a first angle and for polarizing light of a second color from said light source to substantially a second angle which is substantially different from said first angle;
electronic control means for selectively and independently providing a plurality of regions of liquid crystal material in said liquid crystal display with rotating and non-rotating capability of the polarization of light passing therethrough; and added polarizing means, in registry with the liquid crystal display, whereby one but not both of said first and second polarized, colored light may pass at any given time through a region as controlled by said electronic control means.

31. The liquid crystal display module of claim 30 in which said light producing means comprises at least a pair of spaced light sources, said light sources each respectively emitting light of said first color and second color.

32. The liquid crystal display module of cliam 30 in which said electronic control means includes means for dithering the rotating and non-rotating capability of each liquid crystal region back and forth to permit the alternating passage therethrough of light at a rate of at least essentially 20 cycles per second, to provide an apparent variation of colors perceived by a viewer of the display module in given liquid crystal regions, depending on the relative amount of time that each color is allowed to pass through a region.

33. The liquid crystal display module of claim 32 in which said polarizing means comprises a first polarizing filter positioned between said light source and said plates, said first filter passing light of said first color but substantially passing only light of said second color that is polarized at substantially said second angle; a second polarizing filter positioned between said first filter and said plates, said second filter passing light of said second color but substantially passing only light of said first color that is polarized at substantially said first angle.

34. The liquid crystal display module of claim 33 in which said added polarizing means is a colorless polarizer.

* * * * *